(12) United States Patent
Akamatsu et al.

(10) Patent No.: US 6,972,602 B2
(45) Date of Patent: Dec. 6, 2005

(54) POWER-ON RESET CIRCUIT (75) Inventors: Tetsuya Akamatsu, Tenri (JP); Hiroki Doi, Tenri (JP); Masanori Inamori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 10/829,298

(22) Filed: Apr. 22, 2004

(65) Prior Publication Data
US 2004/0212409 A1 Oct. 28, 2004

(30) Foreign Application Priority Data
Apr. 23, 2003 (JP) ............................. 2003-117798

(51) Int. Cl.[7] ............................................... H03L 7/00
(52) U.S. Cl. ..................................................... 327/143
(58) Field of Search ............................. 327/142, 143, 327/198

(56) References Cited

U.S. PATENT DOCUMENTS 4,697,097 A * 9/1987 Rusznyak ................... 327/546
4,812,679 A * 3/1989 Mahabadi ................... 327/143
6,084,446 A * 7/2000 Chen et al. ................. 327/143
6,239,630 B1 * 5/2001 Bowers et al. .............. 327/143

FOREIGN PATENT DOCUMENTS

JP   6-196989 A   7/1994
JP   11-68539 A   3/1999

* cited by examiner

Primary Examiner—Jeffrey Zweizig
(74) Attorney, Agent, or Firm—Birch, Stewart, Kolasch & Birch, LLP (57) ABSTRACT A power-on reset circuit comprises a power supply voltage detection circuit that detects a rise of a power supply voltage and that changes a logic level of a first internal node; a capacitor charge/discharge circuit that charges and discharges a capacitor according to the first internal node level and that in an event that the power supply voltage is reduced, discharges the capacitor to follow the event; and a reset pulse generation circuit that before the power supply voltage rises higher than the predetermined voltage, outputs a first output voltage to an output node and that after the power supply voltage has risen higher than the predetermined voltage, outputs a second output voltage to the output node upon detecting that a charge level of the capacitor has become higher than a charge level detection voltage.

8 Claims, 4 Drawing Sheets

POWER-ON RESET CIRCUIT

This Non-provisional application claims priority under 35 U.S.C. §119(a) on Patent Application No(s). 2003-117798 filed in Japan on Apr. 23, 2003, the entire contents of which are hereby incorporated by reference.

BACKGROUND OF THE INVENTION

1. Field of the Invention

The present invention relates to a power-on reset circuit (which hereinbelow will be referred to as a "POR circuit") for generating a reset pulse by a sensing a power supply voltage rise at a power-on time. More particularly, the invention relates to a POR circuit to be provided to reset another circuit within a same integrated circuit in a semiconductor integrated circuit.

2. Description of Related Art

Conventional POR circuits have a capacitor charge circuit composed of a charging capacitor and a resistor or a constant current source, and outputs a reset pulse at a power-on time. However, in a POR circuit of the above-described type composed only of such the capacitor charge circuit, a problem occurs in that a reset pulse is not generated when a boosting speed rate of the power supply voltage is later than a charge time constant of the capacitor. Conventional techniques dealing with the problem include, for example, a technique disclosed in below-described Japanese Unexamined Patent Publication No. 06-196989 (which hereinbelow will be referred to as a "conventional technique 1") and a technique disclosed in Japanese Unexamined Patent Publication No. 11-68539 (which hereinbelow will be referred to as a "conventional technique 2").

A POR circuit disclosed in the publication of the conventional technique 1 has voltage control means and a pulse generation circuit. The voltage control means inputs a power supply voltage as an input voltage. In response to the event that the input voltage has exceeded a predetermined voltage, the control means outputs the predetermined voltage, and outputs the input voltage when the input voltage is lower than or equal to the predetermined voltage. The pulse generation circuit inputs the output voltage of the voltage control means as an input voltage, and outputs a predetermined pulse in response the event that the difference between the input voltage and the predetermined voltage has reached a predetermined value.

A POR circuit disclosed in the publication of the conventional technique 2 has voltage sensing means and blocking means. Specifically, there are provided a power-supply-voltage sensing circuit that senses entry of the power supply voltage when the blocking means is in the ON state; conducting means that becomes conductive in accordance with a sensed voltage; a capacitor that performs charging via the conducting means in accordance with a time constant; and a capacitor charge time constant circuit having discharging means, and an output circuit. Additionally, in this configuration, the voltage of the capacitor is supplied to the blocking means as a feedback voltage.

Figure 3:
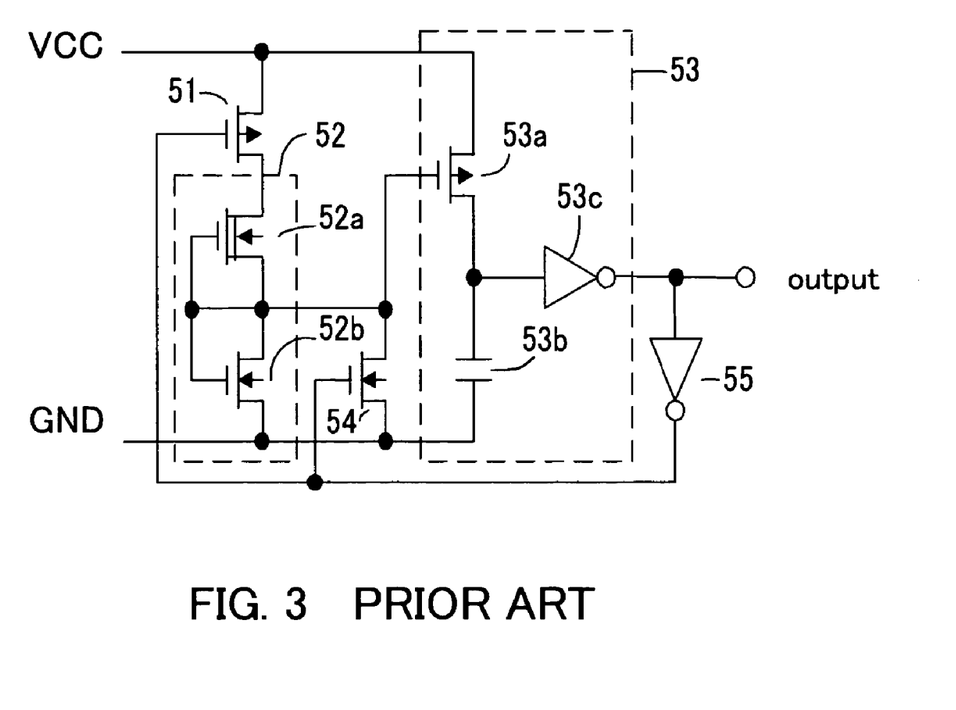
FIG. 3 is a circuit diagram showing an example circuit configuration of a conventional POR circuit.
Figure 4:
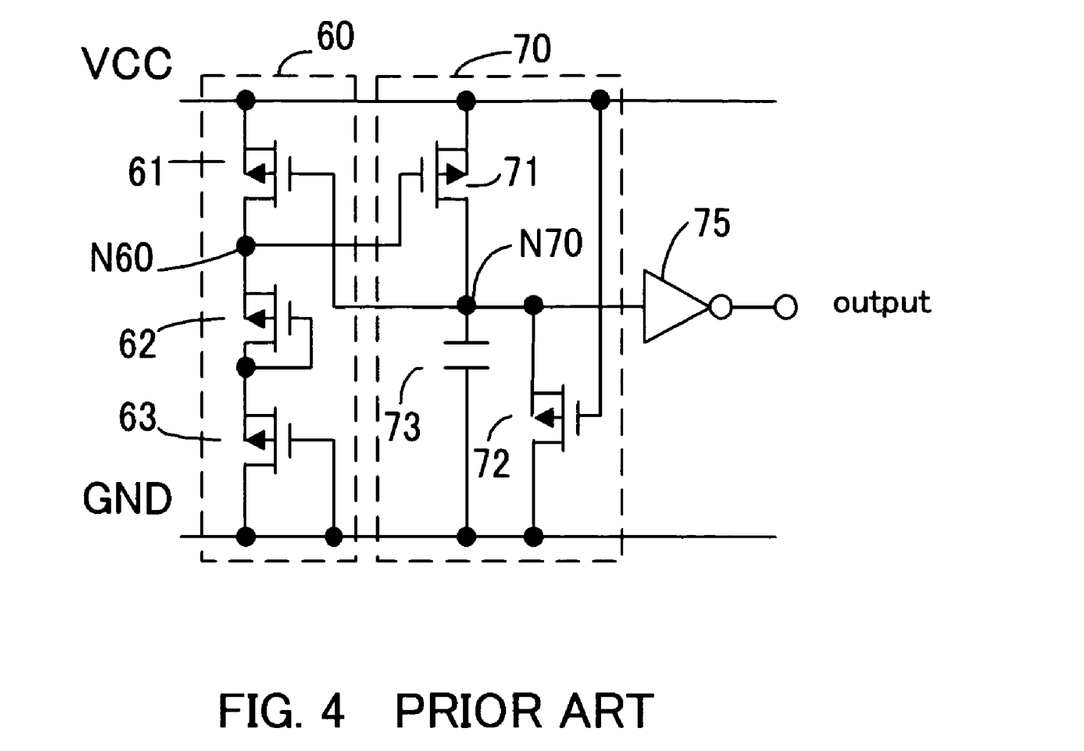
FIG. 4 is a circuit diagram showing an example circuit configuration of another conventional POR circuit.

However, the conventional POR circuit arises problems described hereinbelow. FIGS. 3 and 4 are circuit diagrams showing in detail circuit examples of the conventional POR circuits corresponding to the conventional technique 1 and the conventional technique 2, respectively.

Referring to FIG. 3, the POR circuit shown in detail in the publication of the conventional technique 1 has an enhancement-type PMOS 51 (PMOS transistor) of which the source is connected to a power supply voltage Vcc, and a voltage control circuit 52 connected between the drain of the PMOS 51 and ground GND. The voltage control circuit 52 has a depression-type NMOS 52a (NMOS transistor) of which the drain is connected to the drain of the PMOS 51, and an enhancement-type NMOS 52b in which the gate and the source of the NMOS 52a are connected to the gate and the drain of the NMOS 52b. The drain of an enhancement-type NMOS 54 and a pulse generation section 53 are connected to the output of the voltage control circuit 52. The pulse generation section 53 has an enhancement-type PMOS 53a on which the source is connected to the power supply voltage Vcc, a capacitor 53b connected between the PMOS 53a and the ground GND, and an inverter 53c of which the input is connected to a connection junction between the PMOS 53a and the capacitor 53b. The output of the inverter 53c of the pulse generation section 53 is used as the output of the POR circuit and is connected to an inverter 55. The output of the inverter 55 is connected to the gate of the NMOS 54 of the PMOS 51. The POR circuit according to the conventional technique 1 has the following problems. Since discharging means of the capacitor is not provided, the capacitor cannot securely be discharged, thereby disabling the circuit to normally operate. As such, when the power is reentered after entry of the power, a normal reset pulse cannot be generated unless a time interval longer than a predetermined time interval is provided before the reentry of the power.

With reference to FIG. 4, the POR circuit according to the conventional technique 2 has a power-supply-voltage sensing circuit 60, a capacitor charge time constant circuit 70, and an output circuit 75. The power-supply-voltage sensing circuit 60 has a PMOS 61 that serves as blocking means and that has the source connected to a power supply voltage Vcc; and a PMOS 62 and a PMOS 63 that are series connected between the drain of the PMOS 61 and ground GND and that form a diode serving as voltage sensing means. The source of the PMOS 62 is connected to the drain of the PMOS 61, and the drain of the PMOS 62 is connected to the source of the PMOS 63 and to the gate of the PMOS 62. The gate and the drain of the PMOS 63 are connected to the ground GND. A node N60, which is a connection junction between the drain of the PMOS 61 and the source of the PMOS 62, is the output of the power-supply-voltage sensing circuit 60. The capacitor charge time constant circuit 70 has a capacitor 73; a PMOS 71 serving as conducting means in which the node N60 serving as the output of the power-supply-voltage sensing circuit 60 is connected to the gate, and the source is connected to the power supply voltage Vcc; and a PMOS 72 serving as discharging means in which the gate is connected to the power supply voltage Vcc. A connection junction among the drain of the PMOS 71, the source of the PMOS 72, and the capacitor 73 is a node N70 that is used as the output of the capacitor charge time constant circuit 70, that is connected to the gate of the PMOS 61, and that is connected to the input of an inverter 75. Similar to the power-supply-voltage sensing circuit 60 and the capacitor charge time constant circuit 70, the inverter 75 is driven by the power supply voltage Vcc and is composed such that a reset pulse is output from the output of the inverter 75. However, the POR circuit according to the conventional technique 2 has a problem in that when variations take place in the voltage of the node N70 in the vicinity of a threshold voltage of the inverter 75, a stable reset pulse is not output.

SUMMARY OF THE INVENTION

The invention is made in view of the problems described above. Accordingly, an object of the invention is to provide a POR circuit capable of stably generating a reset pulse, regardless of, for example, occurrence or nonoccurrence of reentry of the power and a boosting speed rate of the power.

In order to achieve the object, as a first feature, a power-on reset ("POR") circuit comprises a power supply voltage detection circuit that detects a rise of a power supply voltage to a predetermined voltage and that causes a logic level of a first internal node from a first level to a second level; a capacitor charge/discharge circuit that discharges a capacitor when the logic level of the first internal node of the power supply voltage detection circuit is the first level and that charges the capacitor via a resistor when the logic level is the second level; and a reset pulse generation circuit that before the power supply voltage rises higher than the predetermined voltage, outputs a first output voltage to an output node and that after the power supply voltage has risen higher than the predetermined voltage, outputs a second output voltage to the output node upon detecting that a charge level of the capacitor has become higher than a charge level detection voltage, wherein in an event that the power supply voltage is reduced, the capacitor charge/discharge circuit discharges the capacitor to follow the event, regardless of the logic level of the first internal node.

More specifically, according to the first feature, the power supply voltage detection circuit comprises a first diode circuit provided between a power supply line for supplying the power supply voltage and a second internal node to serve in a forward direction from the power supply line to the second internal node; a first pulldown circuit provided between the second internal node and a ground line for supplying a ground potential; a first pullup circuit provided between the first internal node and the power supply line to impart the first level to the logic level of the first internal node; and a second pulldown circuit that is provided between the first internal node and the ground line and that is controlled by a voltage level of the second internal node for current driving capability, wherein when the power supply voltage has risen higher than the predetermined voltage, the voltage of the second internal node becomes higher than a threshold voltage that is lower than the predetermined voltage and that is determined by circuit characteristics of the first diode circuit and the first pulldown circuit, whereby the current driving capability of the second pulldown circuit is increased to change a logic level of the internal output node to the second level.

In addition, according to the first feature, a second pullup circuit to be controlled by the voltage level of the first internal node for current driving capability, the resistor, and a third pulldown circuit to be controlled by the voltage level of the first internal node are series connected between the power supply line for supplying power supply voltage and the ground line for supplying the ground voltage; the capacitor is connected between a third internal node, which is a connection junction of the resistor and the third pulldown circuit, and the ground line; and a third diode circuit forming the discharge circuit serving in a forward direction from the third internal node to the power supply line is connected between the power supply line and the third internal node.

According to the POR circuit in the first feature of the invention, in a case where the power is turned off and is reentered after entry of the power, even when the power-supply voltage level has fallen down to the ground level (ground potential of 0 V) in a state where charge provided in the capacitor at the time of the initial power entry still remains, since the capacitor charge/discharge circuit has a first discharge path for discharging the capacitor in the manner that the logic level of the first internal node is changed to the first level, and a second discharge path formed of the discharge circuit, the capacitor can securely be discharged by the second discharge path even after the power supply voltage has fallen down to 0 V during a time when discharge by the first discharge path is not completed, regardless of the logic level of the first internal node. As a consequence, when the power supply voltage has risen higher than the predetermined voltage after reentry of the power, the power supply voltage detection circuit changes the logic level of the first internal node from the first level to the second level, the capacitor charge/discharge circuit again starts charging via the resistor, and the reset pulse generation circuit senses the charge level, thereby enabling securely outputting a reset pulse of a predetermined pulse width that is determined by the charge level detection voltage, the resistance value of the resistor, and the capacitance value of the capacitor. That is, according to the POR circuit of the invention, a reset pulse can be generated, regardless of occurrence or nonoccurrence of reentry of the power.

By way of a second feature, according to the POR circuit of the invention, the reset pulse generation circuit outputs the second output voltage to the output node and reduces the set value of the charge level. More specifically, in the POR circuit according to the second feature, the reset pulse generation circuit comprises an inverter circuit in an initial stage for inputting the charge level of the capacitor as an input voltage and outputs a negation logic level thereof, and a transistor for imparting hysteresis characteristics to the inverter circuit.

According to the POR circuit according to the second feature of the invention, ordinarily a plurality of circuits synchronously starts a reset operation after the reset pulse has once shifted the second output voltage. As such, although a case can take place in which unserious apparent variations in the power supply voltage are caused by AC noise generated by parasitic induction components in the power supply and ground line, the invention can prevent a case where the output of the reset pulse is unstabilized by the variations in the power supply voltage. More specifically, the output of the reset pulse once shifted to the second output voltage returns to the first output voltage, therefore enabling occurrence of, for example, chattering between the first output voltage and the second output voltage to be prevented. The feature is specifically effective when boosting of the power supply voltage is slow.

Further, according to a third feature, the POR circuit of the invention further comprises a power reduction circuit that after the reset pulse generation circuit has output the second output voltage, blocks a DC (direct current) current path occurring in the power supply voltage detection circuit. More specifically, the reset pulse generation circuit has a power reduction circuit that after the reset pulse generation circuit has output the second output voltage, blocks current paths of the first pulldown circuit and the first pullup circuit of the power supply voltage detection circuit.

According to the third feature, in the POR circuit of the invention, DC current paths occurring in the reset pulse generation stage are blocked after the reset pulse generation. As such, the DC current is consumed only by necessity in an initial power-on stage, unnecessary power consumption can be avoided in a long period of time after the reset pulse generation. Consequently, low power consumption can be implemented overall in the circuit.

BRIEF DESCRIPTION OF THE DRAWINGS

In the accompanying drawings:

FIGS. 2(a) to 2(d) are waveform diagrams each showing a voltage or current waveform in a major portion of the embodiment of the POR circuit according to the invention—more specifically.

DETAILED DESCRIPTION OF THE INVENTION

Preferred Embodiment

Referring to the accompanying drawings, an embodiment of a POR circuit of the invention (which hereafter will also be referred to as an "inventive circuit") will be described hereinbelow.

Figure 1:
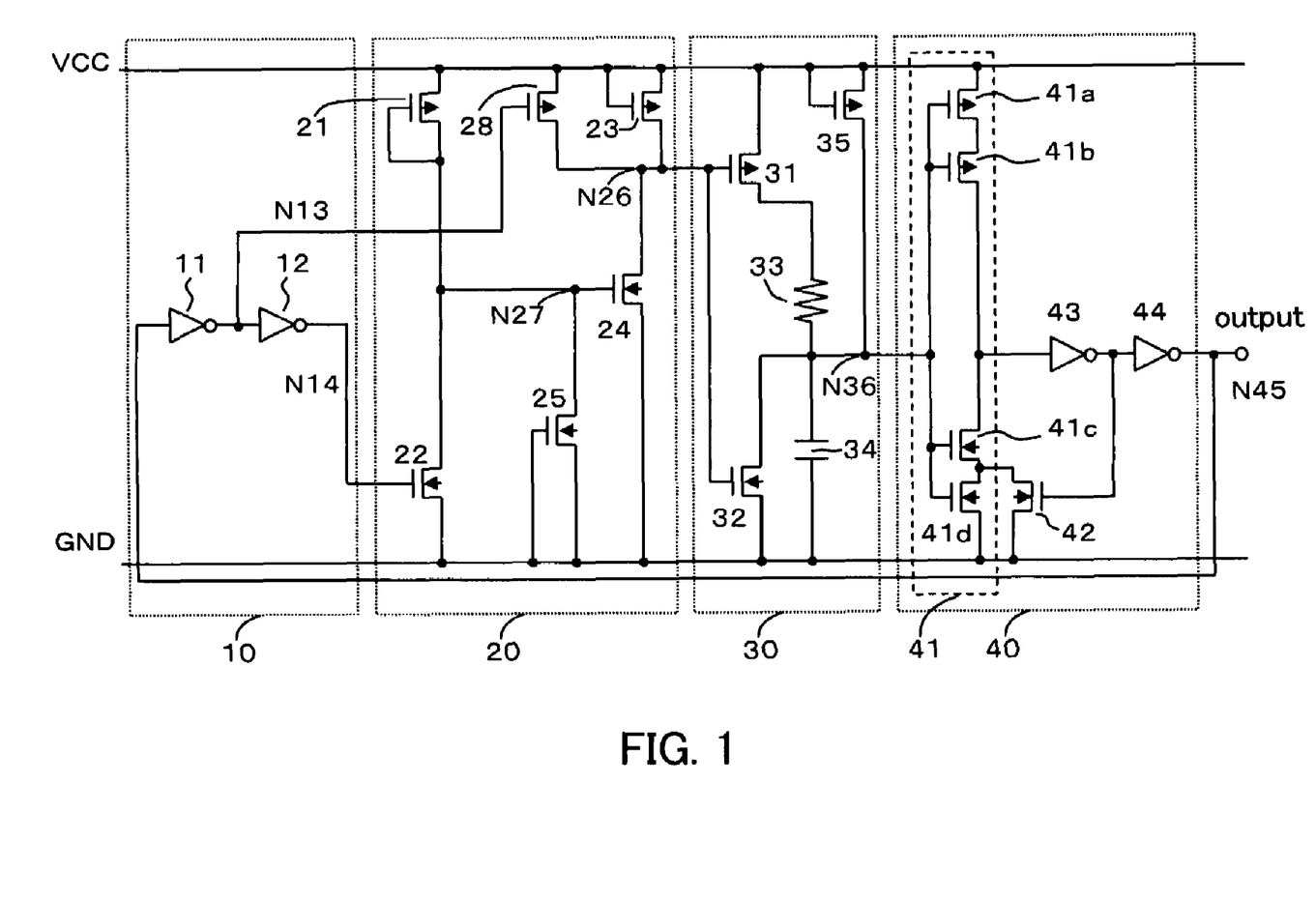
FIG. 1 is a circuit diagram showing a circuit configuration of an embodiment of a POR (power-on reset) circuit according to the invention.

Referring to FIG. 1, the inventive circuit is composed of a power supply voltage detection circuit 20, a capacitor charge/discharge circuit 30, a reset pulse generation circuit 40, and a power reduction circuit 10.

The power supply voltage detection circuit 20 detects a rise of a power supply voltage Vcc to a predetermined voltage V or higher and then causes a logical level of a first internal node N26 to change from a high level (first level) to a low level (second level). More specifically, as shown in FIG. 1, the power supply voltage detection circuit 20 is composed of three P-type MOSFETs (each of which hereinbelow will be referred to as a "PMOS") 21, 23, and 28 and three N-type MOSFETs (each of which hereinbelow will be referred to as a "NMOS") 22, 24, and 25. The PMOS 21 is used to form a first diode circuit in the manner that the source is connected to a power supply line VCC that supplies the power supply voltage to the inventive circuit, and the drain and the gate are connected to a second internal node N27. The first diode circuit is thus formed to serve in a forward direction from the power supply line VCC to the second internal node N27. The NMOS 22 is used to form a first pulldown circuit in the manner that the source is connected to a ground line GND that supplies a ground potential, the drain is connected to the second internal node N27, and the gate is connected to a node N14 of the power reduction circuit 10. The NMOS 25 is used to form a diode circuit in the manner that the source and the gate are connected to the ground line GND, and the drain is connected to the second internal node N27. The diode circuit is thus formed to serve in a forward direction from the ground line GND to the second internal node N27. The PMOS 28 is used to form a first pullup circuit in the manner that the source is connected to the power supply line VCC, the drain is connected to the first internal node N26, and the gate is connected to a node N13 of the power reduction circuit 10. The first pullup circuit thus formed imparts a high level to a logical level of the first internal node N26. The PMOS 23 is used to form a second diode circuit in the manner that the source and the gate are connected to the power supply line VCC, and the drain is connected to the first internal node N26. The second diode circuit is thus formed to serve in a forward direction from the first internal node N26 to the power supply line VCC. The NMOS 24 is used to form a second pulldown circuit in the manner that the source is connected to the ground line GND, the drain is connected to the first internal node N26, and the gate is connected to the second internal node N27. The second pulldown circuit thus formed imparts a low level to the logical level of the first internal node N26.

The NMOS 25 and the PMOS 23 are each in an off state in a normal mode, and they do not exert logical influences to normal circuit operations. However, these transistors serve to determine the potentials in floating states of the second internal node N27 and the first internal node N26, respectively.

The capacitor charge/discharge circuit 30 has a discharge circuit formed to provide the following functionality. When the logical level of the first internal node N26 of the power supply voltage detection circuit 20 is at a high level, the functionality causes a capacitor 34 to be discharged. Alternatively, when the logical level of the node N26 is at a low level, the functionality causes a capacitor 34 to be charged via a resistor 33. In addition, regardless of the logical level, at an event that the power supply voltage Vcc has fallen, the functionality of the discharge circuit causes the capacitor 34 to be discharged following that event. More specifically, as shown in FIG. 1, a PMOS 31, a resistor 33, and an NMOS 32 are series connected in that order between the power supply line VCC and the ground line GND. In addition, the capacitor 34 is connected between a third internal node N36, which is a connection junction between the resistor 33 and the NMOS 32, and the ground line GND. More particularly, the source of the PMOS 31 is connected to the power supply line VCC, the drain of the PMOS 31 is connected to one end of the resistor 33, the other end of the resistor 33 is connected to the drain of the NMOS 32, the source of the NMOS 32 is connected to the ground line GND, and the individual gates of the PMOS 31 and the NMOS 32 are connected to the first internal node N26. In this configuration, the PMOS 31 functions as a second pullup circuit controlled by a voltage level V26 of the first internal node N26 for current driving capability. Additionally, the NMOS 32 functions as a third pulldown circuit controlled by the voltage level V26 of the first internal node N26 for current driving capability. Further, the discharge circuit is formed of a PMOS 35 in the manner that the source and the gate are connected to the power supply line VCC, and the drain is connected to the third internal node N36. Thereby, a third diode circuit is formed to serve in a forward direction from the third internal node N36 to the power supply line VCC. The PMOS 35 determines the potential in a floating state of the third internal node N36.

The reset pulse generation circuit 40 outputs a first output voltage equal to the power supply voltage Vcc to an output node N45 before the power supply voltage Vcc rises to a predetermined voltage V0 or higher. In addition, after the power supply voltage Vcc has risen to a predetermined voltage V0 or higher, the reset pulse generation circuit 40 detects that the charge level V36 of the capacitor 34 has become a charge level detection voltage V1 or higher, outputs a second output voltage (0 V), which is equal to the ground level, to the output node N45, and then terminates a reset pulse. In addition, after termination of the reset pulse, the reset pulse generation circuit 40 reduces a set value of the charge level detection voltage V1. In specific, the reset pulse generation circuit 40 has three CMOS inverters 41, 43, and 44, as shown in FIG. 1. The inverter 41 inputs as an input voltage the charge level V36, which is a charge level of the capacitor, and outputs a negation logic level thereof. The inverter 43 inputs as an input voltage the output voltage of the inverter 41 and outputs a negation logic level thereof. The inverter 44 inputs as an input voltage the output voltage of the inverter 43, and outputs to the output node N45 the first output voltage (Vcc) or the second output voltage (0 V), which is the negation logic level of the input voltage. In addition, the inverter 41 is composed of two series connected PMOSs 41a and 41b and two series connected NMOSs 41c and 41d. There are connected between the source of the PMOS 41a and the power supply line VCC, between the drain of the PMOS 41a and the source of the PMOS 41b, between the drain of the PMOS 41b and the drain of the NMOS 41c, between the source of the NMOS 41c and the drain of the NMOS 41d, between the source of the NMOS 41d and the ground line GND, and between the individual gates of the PMOSs 41a and 41b and the NMOSs 41c and 41d and the third internal node N36. A connection junction between the drain of the PMOS 41b and the drain of the NMOS 41c is used as the output of the inverter 41. In addition, an NMOS 42 is provided to impart hysteresis characteristics to the inverter 41. More specifically, a connection junction between the source of the NMOS 41c and the drain of the NMOS 41d is connected to the drain of the NMOS 42, and the ground line GND is connected to the source of the NMOS 42. In this configuration, in an initial state, the NMOS 42 is in an off state, and an input inverted level of the inverter 41 (i.e., the charge level detection voltage V1) is an initial set value V1a. However, when the inverter 44 outputs the second output voltage (0 V) to an output node N45, also the NMOS 42 becomes an ON state. Thereby, the current driving capability on the NMOS side of the CMOS inverter 41 is enhanced, and an input inverted level (threshold voltage) drops from the initial set value V1a to a level V1b.

The power reduction circuit 10 turns off the individual PMOS 28 and NMOS 22 of the power supply voltage detection circuit 20 to block a DC (direct current) current path occurring in the power supply voltage detection circuit 20. More specifically, as shown in FIG. 1, the power reduction circuit 10 is composed of two CMOS inverters 11 and 12. The output node N45 of the inverter 44 is connected to the input of the inverter 11, an output (node N13) of the inverter 11 is connected to the gate of the PMOS 28 and the input of the inverter 12, and the output (node N14) of the inverter 12 is connected to the gate of the NMOS 22. In this configuration, when the output node N45 becomes the second output voltage (0 V), the inverter 11 outputs the power supply voltage Vcc and then turns off the PMOS 28. Concurrently, the inverter 12 outputs the ground level and then turns off the NMOS 22. Consequently, in response to a logic level of a reset pulse, the DC current path of the power supply voltage detection circuit 20 is blocked, so that the voltage level V26 of the first internal node N26 falls down to the ground level after termination of the reset pulse. Thereby, the capacitor charge/discharge circuit 30 is fixed to a charge state, and current consumption other than that for charge current is avoided. In this manner, in the vicinity of the input inverted level of the inverter 41, the voltage of the third internal node N36 restrains variations, and enables the output of a stabilized reset pulse to be secured.

Figure 2:
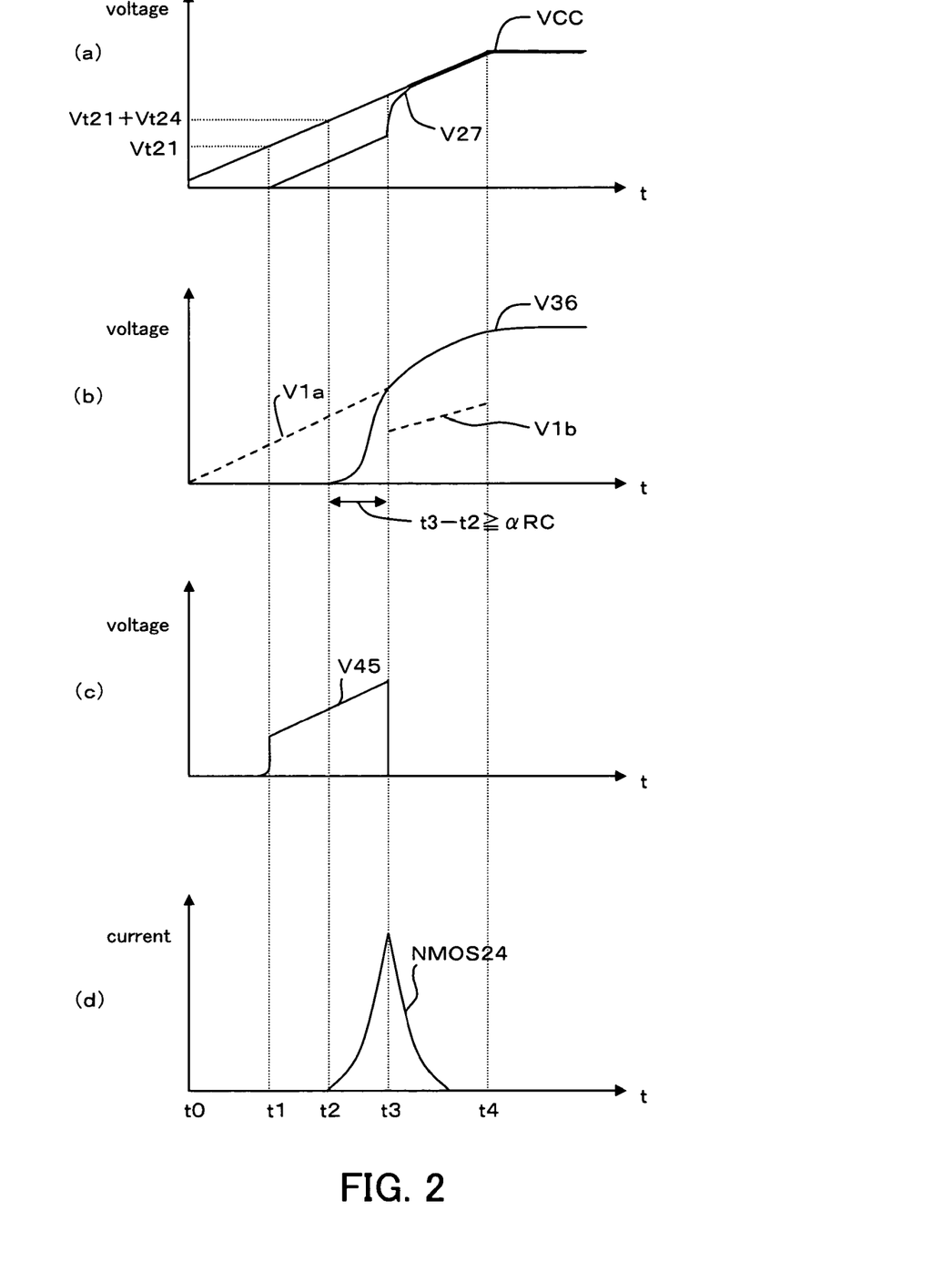
FIG. 2(a) shows voltage waveform diagrams of a power supply voltage Vcc and a voltage V27 of a second internal node.
FIG. 2(b) shows voltage waveform diagrams of a voltage V36 of a third internal node N36 and an input inverted level of an inverter 41.
FIG. 2(c) shows a voltage waveform diagram of an output voltage V45 of an inverter 44.
FIG. 2(d) is a current waveform diagram of a current flowing through an NMOS 24.

Operation of the inventive circuit will be described hereinbelow with reference to voltage or current waveform diagrams of FIGS. 2(a) to 2(d). FIG. 2(a) shows voltage waveform diagrams of the power supply voltage Vcc and the voltage V27 of the second internal node. FIG. 2(b) shows voltage waveform diagrams of the voltage V36 of the third internal node N36 (charge level of the capacitor 34) and an input inverted level (charge level detection voltage V1) of an inverter 41. FIG. 2(c) shows a voltage waveform diagram of an output voltage V45 of an output node N45 of the inverter 44.

FIG. 2(d) is a current waveform diagram of a current flowing through the NMOS 24. As shown in FIG. 2(a), a case is assumed in which power on takes place at time t0, the power supply voltage Vcc monolithically grows in the period from the time t0 to time t4, and a constant voltage is maintained thereafter.

First, when the power supply voltage Vcc is 0 V, the PMOS 35 constituting the third diode circuit serving as the discharge circuit transfers charge in the capacitor 34 to the side of power supply voltage Vcc. From this state, the power supply voltage Vcc rises, as shown in FIG. 2(a); and from the vicinity of the time (t1) where the voltage exceeds a threshold voltage Vt21 of the PMOS 21, the voltage V27 of the second internal node N27 follows the rise of the power supply voltage Vcc to rise at a voltage value lower by Vt21 than the power supply voltage Vcc. Although not shown, since the NMOS 22 serving as the first pulldown circuit for the second internal node N27 turns on from the time at which the power supply voltage Vcc has exceeded a threshold voltage Vt22 of the NMOS 22, the voltage V27 of the second internal node N27 is slightly lower than the voltage value that is lower by Vt21 than the power supply voltage Vcc. However, the NMOS 22 is used to stably and securely reduce the voltage level of the voltage V27 to be lower by at least Vt21 than the power supply voltage Vcc and to secure followership to the power supply voltage Vcc, and the voltage drop amount thereof is restrained to fall within a predetermined range.

Referring to now to FIG. 2(c), the first output voltage of the output node N45 of the inverter 44 follows the power supply voltage Vcc to rise from the vicinity of time t1 where the voltage exceeds a threshold voltage of a PMOS (not shown) constituting the inverter 43.

Although not shown, when the power supply voltage Vcc has risen higher than a threshold voltage Vt28 of the PMOS 28 (at about time after time t1), the output voltage of the output node N45 of the inverter 44 outputs the power supply voltage Vcc. As such, the output (node N13) of the inverter 11 of the power reduction circuit 10 maintains the ground level (0 V), turns on the PMOS 28 of the power supply voltage detection circuit 20, and the voltage level V26 of the first internal node N26 rises following the power supply voltage Vcc.

In addition, from the vicinity of time (t2) where the voltage exceeds a voltage value V0 which is slightly higher than the total level (Vt21+Vt24), the voltage V27 of the second internal node N27 rises higher than a threshold voltage Vt24 of the NMOS 24. Accordingly, as shown in FIG. 2(d), the NMOS 24 turns on, forms a DC current path to allow the current to flow from the power supply voltage Vcc via the PMOS 28 to the ground line GND, and concurrently lowers the voltage level V26 of the first internal node N26. The PMOS 28 is primarily used to maintain the voltage of the voltage level V26 to the power supply voltage Vcc or the vicinity thereof until the NMOS 24 turns on, so that it need not have high current driving capability. As such, in the case that the NMOS 24 provides current driving capability (low on-resistance) higher than that of the PMOS 28, when the NMOS 24 turns on, the voltage level V26 of the first internal node N26 falls. However, when the voltage level V26 falls, the drain voltage of the PMOS 28 grows, and also the current driving capability is enhanced. For this reason, the voltage level V26 does not completely drops to the ground level.

As the voltage level V26 of the first internal node N26 reduces, the PMOS 31 of the capacitor charge/discharge circuit 30 turns on, and the NMOS 32 turns off. Charge remained not discharged is totally discharged out via the NMOS 32 during a period (to the time t2) until the rise of the power supply voltage Vcc exceeds the total level (Vt21+Vt24) of the threshold value Vt21 of the PMOS 21 and the threshold voltage Vt24 of the NMOS 24.

When the PMOS 31 turns on and the NMOS 32 turns off, the capacitor 34 is charged in accordance with time constants of the resistor 33 and the capacitor 34. As is shown in FIG. 2(b), the charge level V36 of the third internal node N36 begins rising after having exceeded the time t2. When the charge level reaches an input inverted level (threshold voltage) V1 (the initial set value thereof is V1a) of the inverter 41 of the reset pulse generation circuit 40 (i.e., upon arrival at time t3), the individual output levels of the inverters 41, 43, and 44 are sequentially inverted. As shown in FIG. 2(c), the output voltage V45 of the output node the inverter 44 transits the first output voltage (Vcc) to the second output voltage (0 V). Concurrently, the output of a reset pulse activated with the output voltage V45 risen following the power supply voltage Vcc terminates upon transition of the output of the inverter 44 to the second output voltage (0 V).

In this stage, the output of the inverter 43 is input to the gate of the NMOS 42 to impart the hysteresis characteristics to the inverter 41, as described above. Thereby, after termination of the reset pulse, the input inverted level (threshold voltage) is switched from the initial set value V1a to the low voltage level V1b.

While the reset pulse (V45) of the inverter 44 is the output of the POR circuit, the pulse is also input to the inverter 11 of the power reduction circuit 10. In response to the output voltage V45 of the reset pulse, the power reduction circuit 10 turns off the PMOS 28 and the NMOS 22 of the power supply voltage detection circuit 20.

When the NMOS 22 turns off after the time t3, a DC current path associated with the second internal node N27 occurs only with sub-threshold currents of the PMOS 21 and the NMOSs 22 and 25, hence no substantial DC current flows therethrough. Accordingly, the second internal node N27 of the voltage V27 rises up to the vicinity of the power supply voltage Vcc.

Similarly, when the PMOS 28 turns off after the time t3, a DC current path associated with the first internal node N26 occurs only with sub-threshold currents of the PMOSs 23 and 28, hence no substantial DC current flows therethrough. In this case, since the voltage V27 of the second internal node N27 turns on the NMOS 24, the voltage of the first internal node N26 falls down to the ground level (0 V). Thereby, the capacitor charge/discharge circuit 30 is fixed to a charge state, and current consumption other than that for charge current is avoided. In this manner, in the vicinity of the input inverted level of the inverter 41, the voltage of the third internal node N36 restrains variations, and enables the output of a stabilized reset pulse to be secured.

As described above, the inventive circuit has the power supply voltage detection circuit 20, the capacitor charge/discharge circuit 30, the reset pulse generation circuit 40, and the power reduction circuit 10. When the power supply voltage Vcc rises higher than the voltage (Vt21+Vt24), the capacitor 34 of the capacitor charge/discharge circuit 30 is charged in accordance with the time constants of the resistor 33 and the capacitor 34. Regardless of the boosting speed rate of the power supply voltage Vcc, the above-described arrangement all times enables generating a reset pulse of at least αCR. The αCR is determined by the input inverted level V1 (initial set value V1a) of the inverter 41, the resistance value of the resistor 33, and the capacitance value of the capacitor 34 (α is a value determined by V1 and the time constant CR. According to Equation 1 shown below that expresses the output voltage of a CR integration circuit, when V1 is ½ of the power supply voltage Vcc, α=0.693). In Equation 1, $e_o$ and $e_i$ are, respectively, the output voltage and the input voltage of the CR integration circuit, R is the resistance value of the resistor 33, and C is the capacitance value of the capacitor 34.

$$e_o = e_i(1-e^{-1/CR}) \quad (1)$$

The DC current path of the power supply voltage detection circuit 20 is blocked by the power reduction circuit 10 after termination of the reset pulse to avoid DC current consumption thereafter. In addition, according to the configuration of the inventive circuit, even when the power is reentered, the capacitor 34 can be discharged in two ways with the PMOS 35 and the NMOS 32, so that the reset pulse can be securely generated.

The POR circuit of the invention is not limited to the configuration of the embodiment shown in FIG. 1. Part or all of the power supply voltage detection circuit 20, the capacitor charge/discharge circuit 30, the reset pulse generation circuit 40, and the power reduction circuit 10 may be individually practiced by making various modifications and changes without departing the technical concepts.

In the embodiment described above, while the configuration having the power reduction circuit 10 has been exemplified, the power reduction circuit 10 need not be provided.

In addition, the exemplified embodiment imparts the hysteresis characteristics to the initial-stage inverter 41 of the reset pulse generation circuit 40. However, also the technique of implementing the hysteresis characteristics is not limited to that of the embodiment described above. Moreover, while the inverter 41 preferably has the hysteresis characteristics, the inverter 41 may be practiced without the hysteresis characteristics.

As described above, according to the invention, the POR circuit can be implemented in which at the event of either entry of the power or reentry of the power after the power-on operation, regardless of a boosting speed rate of the power, a reset pulse of at least αCR can be generated at all times. The αCR is determined by the input inverted level V1 (initial set value V1a) of the inverter 41, the resistance value of the resistor 33, and the capacitance value of the capacitor 34 (R is the resistance value of the resistor 33, C is the capacitance value of the capacitor 34, and α is a value determined by V1 and the time constant CR of the resistor 33 and the capacitor 34). Further, according to the POR circuit of the invention, by appropriately tuning at least one of the resistance value of the resistor 33 and the capacitance value of the capacitor 34 of the capacitor charge/discharge circuit 30, the reset pulse generation time (pulse width) can easily be changed. Concurrently, after termination of the reset pulse, the DC current consumption in the POR circuit can be made to be zero. Furthermore, according to the POR circuit of the invention, with the feature circuit configuration specific to the invention and the two way executions of discharging the capacitor 34, stable reset pulse generation can be implemented.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A power-on reset circuit comprising:
   a power supply voltage detection circuit that detects a rise of a power supply voltage to a predetermined voltage and that causes a logic level of a first internal node to go from a first level to a second level;
   a capacitor charge/discharge circuit that discharges a capacitor when the logic level of the first internal node of the power supply voltage detection circuit is the first level and that charges the capacitor via a resistor when the logic level is the second level; and
   a reset pulse generation circuit that before the power supply voltage rises higher than the predetermined voltage, outputs a first output voltage to an output node and that after the power supply voltage has risen higher than the predetermined voltage, outputs a second output voltage to the output node upon detecting that a charge level of the capacitor has become higher than a charge level detection voltage,
   wherein in an event that the power supply voltage is reduced, the capacitor charge/discharge circuit discharges the capacitor to follow the event, regardless of the logic level of the first internal node.

2. The power-on reset circuit as claimed in claim 1, wherein the reset pulse generation circuit outputs the second output voltage to the output node and reduces a set value of the charge level detection voltage.

3. The power-on reset circuit as claimed in claim 1, further comprises a power reduction circuit that after the reset pulse generation circuit has output the second output voltage, blocks a DC (direct current) current path occurring in the power supply voltage detection circuit.

4. The power-on reset circuit as claimed in claim 1, wherein the power supply voltage detection circuit comprises:
   a first diode circuit provided between a power supply line for supplying the power supply voltage and a second internal node to serve in a forward direction from the power supply line to the second internal node;
   a first pulldown circuit provided between the second internal node and a ground line for supplying a ground potential;
   a first pullup circuit provided between the first internal node and the power supply line to impart the first level to the logic level of the first internal node; and
   a second pulldown circuit that is provided between the first internal node and the ground line and that is controlled by a voltage level of the second internal node for current driving capability,
   wherein when the power supply voltage has risen higher than the predetermined voltage, the voltage of the second internal node becomes higher than a threshold voltage that is lower than the predetermined voltage and that is determined by circuit characteristics of the first diode circuit and the first pulldown circuit, whereby the current driving capability of the second pulldown circuit is increased to change a logic level of the first internal node to the second level.

5. The power-on reset circuit as claimed in claim 4, further comprises a power reduction circuit that after the reset pulse generation circuit has output the second output voltage, blocks current paths of the first pulldown circuit and the first pullup circuit of the power supply voltage detection circuit.

6. The power-on reset circuit as claimed in claim 1, wherein the capacitor charge/discharge circuit is composed in the manner that:
   a second pullup circuit to be controlled by the voltage level of the first internal node for current driving capability, the resistor, and a third pulldown circuit to be controlled by the voltage level of the first internal node are series connected between the power supply line for supplying power supply voltage and the ground line for supplying the ground voltage;
   the capacitor is connected between a third internal node, which is a connection junction of the resistor and the third pulldown circuit, and the ground line; and
   a third diode circuit forming the discharge circuit serving in a forward direction from the third internal node to the power supply line is connected between the power supply line and the third internal node.

7. The power-on reset circuit as claimed in claim 1, wherein the reset pulse generation circuit comprises:
   an inverter circuit in an initial stage for inputting the charge level of the capacitor as an input voltage and outputting a negation logic level thereof; and
   a transistor for imparting hysteresis characteristics to the inverter circuit.

8. The power-on reset circuit as claimed in claim 1, wherein:
   the capacitor charge/discharge circuit is composed so that at least one of a capacitance value of the capacitor and a resistance value of the resistor can be changed; and
   the reset pulse generation circuit outputs the first output voltage of a pulse width larger than a length that is determined by the charge level detection voltage, the capacitance value of the capacitor, and the resistance value of the resistor.

* * * * *